US006630667B1

(12) United States Patent
Wang et al.

(10) Patent No.: US 6,630,667 B1
(45) Date of Patent: Oct. 7, 2003

(54) COMPACT, HIGH COLLECTION EFFICIENCY SCINTILLATOR FOR SECONDARY ELECTRON DETECTION

(75) Inventors: Li Wang, San Jose, CA (US); Timothy Michael Montagne, Fremont, CA (US); Sergey Etchin, Cupertino, CA (US); Subramanian V. Sankar, Fremont, CA (US)

(73) Assignee: NPTest, LLC, San Jose, CA (US)

( * ) Notice: Subject to any disclaimer, the term of this patent is extended or adjusted under 35 U.S.C. 154(b) by 253 days.

(21) Appl. No.: 09/675,981

(22) Filed: Sep. 29, 2000

(51) Int. Cl.[7] ................................................ G01N 23/00
(52) U.S. Cl. .................... 250/310; 250/306; 250/309
(58) Field of Search ................................ 250/283, 367, 250/309, 370.11, 361 R

(56) References Cited

U.S. PATENT DOCUMENTS 4,588,890 A    5/1986    Finnes ........................ 250/307
4,680,468 A    7/1987    Bouchard et al. ........... 250/310

OTHER PUBLICATIONS

U.S. patent application Ser. No. 05/097,127, Hildenbrand, filed Mar. 1992.*

* cited by examiner

*Primary Examiner*—John R. Lee
*Assistant Examiner*—James J Leybourne

(57) ABSTRACT

A scintillator assembly used in a FIB (Focused Ion Beam) system to detect secondary electrons achieves nearly 100 percent collection efficiency for the majority of useful secondary electron energy ranges. Further, the insulator in the assembly is placed such that it is completely out of the secondary electron path in order to avoid arcing which affects FIB secondary electron imaging. Also, the gap between the grounding cap and the scintillator allows high collection efficiency offered by earlier designs to be retained, and at the same time, improves the system reliability. Further, the scintillator assembly may be placed closer to the primary ion beam, which further improves collection efficiency.

12 Claims, 3 Drawing Sheets

COMPACT, HIGH COLLECTION EFFICIENCY SCINTILLATOR FOR SECONDARY ELECTRON DETECTION

BACKGROUND OF THE INVENTION

1. Field of the invention

This disclosure relates to a compact, high collection efficiency scintillator used to obtain high-resolution images of devices in FIB (Focused Ion Beam) systems.

2. Description of the Related Art

Over the past two decades, liquid metal ion source (LMIS) based focused ion beam (FIB) systems have found numerous applications in various branches of science and industry. For example, within the semiconductor industry, focused ion beam systems are used for integrated circuit (IC) device modification, failure analysis, probe point creation, photomask repair, maskless lithography, TEM sample preparation, scanning ion microscopy and secondary ion mass spectroscopy. In many of these applications, there is a need to obtain high-resolution FIB images of the device on which the FIB is operating. The images allow a determination of the affect of beam on the device. For example, obtaining high quality cross-sectional images of a semiconductor IC device is essential for identifying process defects. In general, there are two important parameters that jointly affect the FIB image quality:

(1) the spot size of the ion beam which, in mm, is determined by the ion column optics, and (2) the collection efficiency of the secondary electron detection system, which affects the image contrast level. (The secondary electrons are those that come off the device as a result of the incident FIB.)

It is well known that the image resolution improves with decreasing spot size of the ion-beam. It is also known that the spot size of the ion beam varies inversely as the beam current. As a result, higher image resolutions can be obtained by using smaller beam currents. Typically, ion beam currents of 1 pA or lower give rise to high resolution images that compensate for the low signal-to-noise ratios (SNR) that is inherently associated with small beam currents. Also, according to Orloff et al. if the Rayleigh criterion is used to quantify the image resolution, then there is a direct correlation between the image resolution and the image contrast level. The image contrast level is, in turn, directly dependent on the number of secondary electrons actually collected by the secondary electron detection system. Scintillators collecting electrons at the lowest frequencies with highest probability are most effective, since the most probable secondary electron energies are around 0–5eV . See Goldstein, et al., "Scanning Electron Microscopy and X-Ray Microscopy", 2nd Edition, Plenum, 1992.

Even though it is difficult to quantify the dependence of the image resolution on the secondary electron collection efficiency, possibly the secondary electron collection efficiency is indeed a limiting factor with regard to image resolution. It is therefore of great practical interest to incorporate secondary electron detectors having high collection efficiency.

A common type of the secondary electron detector used in FIB systems is the Everhart-Thornley type. The Everhart-Thornley type scintillators have been used for many years in charged particle (ion or electron beam) instruments for collecting secondary electrons. This design typically consists of a flat scintillator that emits photons in proportion to the number of electrons striking it, a light pipe to deliver the photons to the photoelectron multiplier tube, and a cap or mesh on which a positive bias voltage is normally applied to increase the collection efficiency. U.S. Pat. No. 4,588,890 titled "Apparatus and method for composite image formation by scanning electron beam" discusses the Everhart-Thoruley detector and is incorporated herein by reference.

However, the present inventors have identified several deficiencies in these prior art scintillators.

SUMMARY

The present inventors have recognized that in the past, the spatial orientation of the collector relative to the sample and primary beam column was not optimized through range. The compactness of the whole assembly was also not emphasized. In FIB systems, many practical considerations, such as vacuum pumping speed and mechanical interference with gas injectors and mechanical probes, require that the scintillator assembly be as small as possible without sacrificing the secondary electron collection efficiency. Also, we determined that applying a bias voltage could have an influence on the primary ion beam as well as other sensors inside the chamber.

We optimized in one embodiment the position, the angle of the scintillator disk relative to the sample and the column, and the shape of the ground cap, to achieve 100% collection efficiency using a very compact scintillator assembly, with typical bias voltage.

The present scintillator has optimal geometry, orientation, and overall size to achieve near 100 percent collection efficiency for the majority of useful secondary electron energy ranges. Further, the scintillator may be placed closer to the primary ion beam, which further improves collection efficiency. This greatly improves the quality of images produced and the reliability of the system.

The present scintillator avoids primary ion beam deflection fluctuations, which affect the normal FIB imaging, cutting and deposition operations. These fluctuations result from accumulated charge on the insulator between the scintillator disk and ground cap reaching a certain threshold and subsequent discharge or arcing. As a result, the spatial electrical potential distribution also changes suddenly. To solve the problem of insulator charge-up, the present scintillator provides ultra-high collection efficiency and is also much less susceptible to charging. The insulator is placed such that it is completely out of the secondary electron path. At the same time, the gap between the grounding cap and the high voltage scintillator disk and its holding ring is increased. This allows collection efficiency, and at the same time, improves the system reliability significantly.

DETAILED DESCRIPTION

Figure 1:
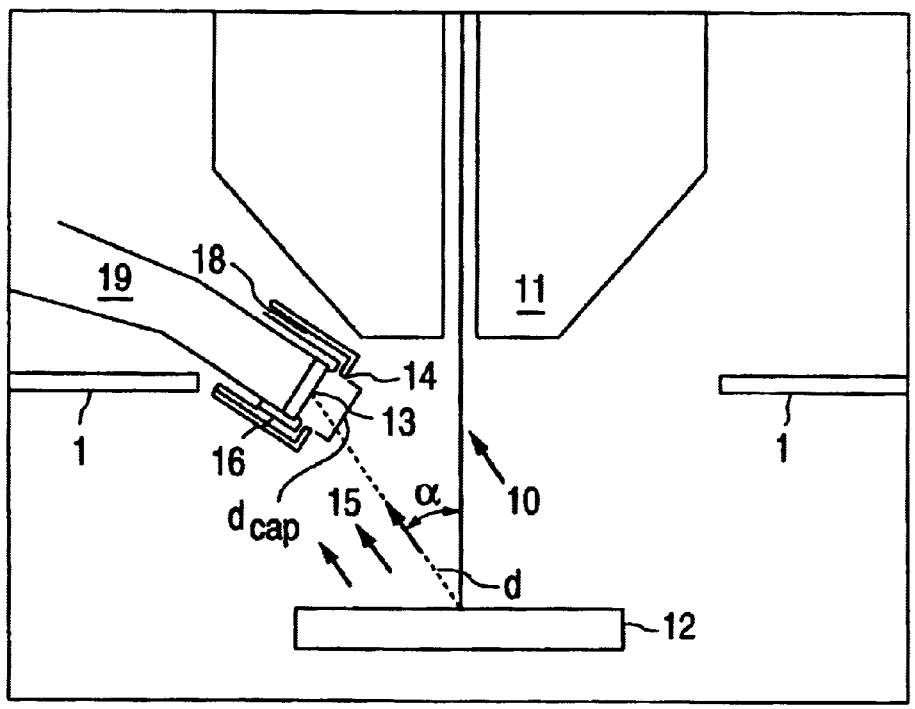
FIG. 1 shows the present scintillator assembly placed inside the FIB chamber

FIG. 1 illustrates the present scintillator in an FIB chamber. The sliding seal 1, which is a ground conductor, may not be present in other FIB system 8 and is merely part of the vacuum containment in which the scintillator assembly is contained. This scintillator should be useful in other systems, since the sliding seal 1 affects the electron collection efficiency very little. A primary charged particle (ion) beam 10 emanates from a conventional column body 11 and travels along an optical axis coaxial with the path of the primary (ion) beam 10. This primary beam 10 is a charged particle beam consisting of ions or electrons. The beam 10 strikes a sample (workpiece), such as a semionconductor IC device that will be operated on and imaged, and secondary electrons are deflected from the sample toward the scintillator disk 13 in the general direction indicated by arrows 15. The working distance between the workpiece and assembly is shown by dotted line d, and the angle between the optical axis and the axis of the assembly is shown by $\alpha$. A bias voltage is applied to the scintillator disk 13 by conductor 16 which may also be referred to a scintillator cap. The assembly also includes an insulator 18 located behind the scintillator disk 13, and a light pipe 19 which carries photons emitted by the disk 13 to a conventional photodetector (not shown). The scintillator assembly used herein is based on the Everhart-Thornley type scintillator assembly, discussed above.

The ground cap 14 helps to shape the biasing electric field around the scintillator disk 13 so that it does not affect the primary beam 10. The bore diameter of the ground cap 14 is shown by the distance dcap in FIG. 1. In general, if grounding cap 14 is far from the scintillator disk 13 on which a 8–12 kV voltage is applied, its effect on the collection efficiency of the assembly is normally negligible. The location of the ground cap 14 affects the electric field distribution around the scintillator disc 13 and, consequently, around the optical axis that is coincident with the beam path 10. This effect may perturb the primary beam 10 and affect image quality. A small electric field distribution on the optical axis is tolerable since it only shifts the primary beam 10 slightly, but the presence of a large electric field on the optical axis would introduce some distortion into the resulting image. Therefore, not only is collection efficiency be maximized to optimize the quality of images produced, but the ground cap 14 also is positioned to minimize axial field distribution along the optical axis to optimize image quality.

Figure 2:
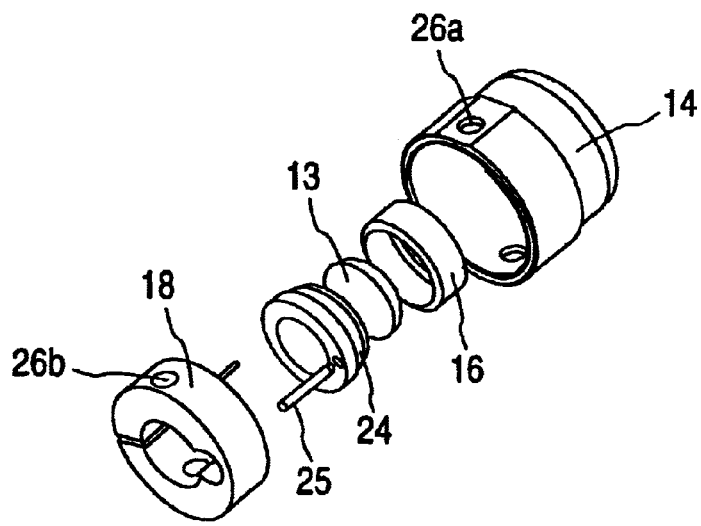
FIG. 2 shows a detailed view of the scintillator assembly.

FIG. 2 depicts in an exploded view more detailed of the scintillator assembly of FIG. 1. The conventional scintillator disk 13 is surrounded by a scintillator cap 16 at its periphery. The disk 13 is held is place between a scintillator base 24 and cap 16 which is screwed onto the threaded base 24. The hole in the cap 16 on its front side is smaller than the hole on its rear side through which it is screwed onto the base 24, and the front side hole has a smaller diameter than the diameter of the disk 13. This allows the disk 13 to be held in place between the base 24 and cap 16 while allowing electrical connection between the conducting cap 16 and the front of the disk 13. The high voltage pin 25 allows quick connection and disconnection of the high voltage bias cables (not shown), which provide the biasing voltage to the assembly. Pin 25 is constructed in a manner (standard for high voltage assemblies) in that it has no sharp edges. Pin 25 makes an electrical connection with the base 24 to which it is braced and to the conducting cap 16 via the cap's connection to the base 24 when the cap 16 is screwed onto the base 24. The scintillator base 24 is inserted into the insulator 18. Ground cap 14 encases the disk 13, cap 16, base 24, and insulator 18, as can be seen by reference to FIGS. 1 and 2. The assembly is held together by a screw inserted into the ground cap 14 and insulator 18 at holes 26a and 26b, respectively. The insulator 18 is located on the side of the scintillator disk 13 opposite to where secondary electrons strike the disk 13, so that it is totally out of the path of secondary electrons.

This prevents causing the insulator to become negatively charged. In the prior art when the accumulated charge on a scintillator insulator would reach a certain threshold, discharge or arcing would occur. This, in turn, resulted in primary ion beam deflection fluctuations, which affected the normal FIB imaging, cutting and deposition operations.

In FIG. 2 the insulator is placed such that it is completely out of the secondary electron path. At the same time, the gap between the grounding cap and the high voltage scintillator disk and its holding ring is maximized. This allows high collection efficiency and at the same time, improves system reliability.

Figure 3:
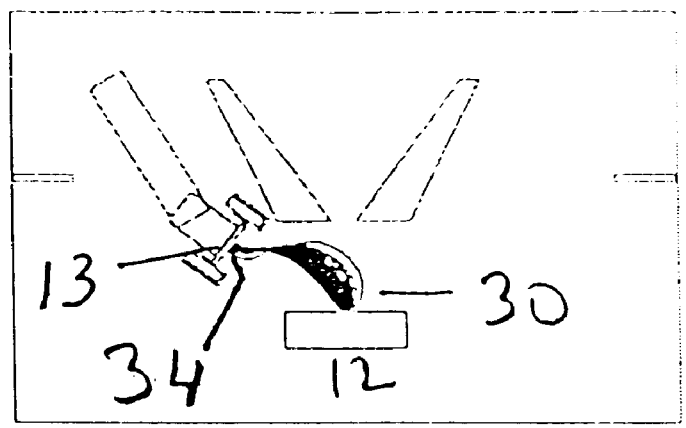
FIG. 3 shows simulated secondary electron trajectories for 10 eV secondary electrons.

FIG. 3 shows a plot (dark area) of secondary electron trajectories from the sample 12 to the focus spot 34 on the scintillator assembly for the FIG. 1 apparatus. The trajectories plotted are for secondary electrons with energies of 10 eV. The initial secondary electron spatial distribution upon leaving the sample 12 is assumed uniform in the upper half space indicated by 30. Clearly, the collection efficiency in this design is 100 percent since all of the secondary electrons hit the scintillator 13 disk as depicted in FIG. 3. Most of these electrons hit the disk 13 at the focal point 34 in the center of the disk 13. The electric field in the scintillator chamber is at a maximum level where the primary beam 10 hits the sample.

Software (e.g. EO-3D package) was used to achieve optimal positioning and dimensions of the scintillator components. This software is capable of three-dimensional charged particle ray tracing based on a finite difference method. An effective way to optimize such a complicated charged particle scintillator as embodied here is to conduct numerous trials in order to determine trends in collection efficiency results when some parameters are fixed while other parameters are allowed to vary. The position of the scintillator assembly is often limited by the mechanical arrangement of the sample chamber with minimal allowable positional variation. There is however more freedom to vary the angle of the scintillator disk and to vary the geometrical shape of the grounding cap.

It was determined that the scintillator parameters depend on the working distance d and the relative positions of the scintillator to the column body 11 Some of the most important parameters are the proximity of the scintillator disk 13 to the sample, the angle between the disk 13 and the optical axis of beam 10 ($\alpha$), the working distance (d) between the scintillator assembly and the sample, and the bore diameter of the cap (dcap). For instance, software may be used to determine an optimal $\alpha$ for a constant working distance d and bore diameter dcap. FIG. 1 shows an embodiment in which $\alpha=29°$, d=20 mm, the diameter of the cap bore dcap=12 mm, the diameter of the scintillator disk is 10 mm, the scintillator voltage 10 kV and all other conductors such as the cap and the column body are grounded.

As mentioned above, the collection efficiency is not the only important criterion to consider in a scintillation. Interference with the primary beam 10 is also a factor when the electric field distribution on the optical axis of the beam is large enough to cause large image shifts and scan distortions. The cap bore diameter dcap is changed during the optimization process to balance the axial potential magnitude and collection efficiencies. The maximum level of the field occurs at the sample and is less elsewhere along the primary beam 10.

Figure 4:
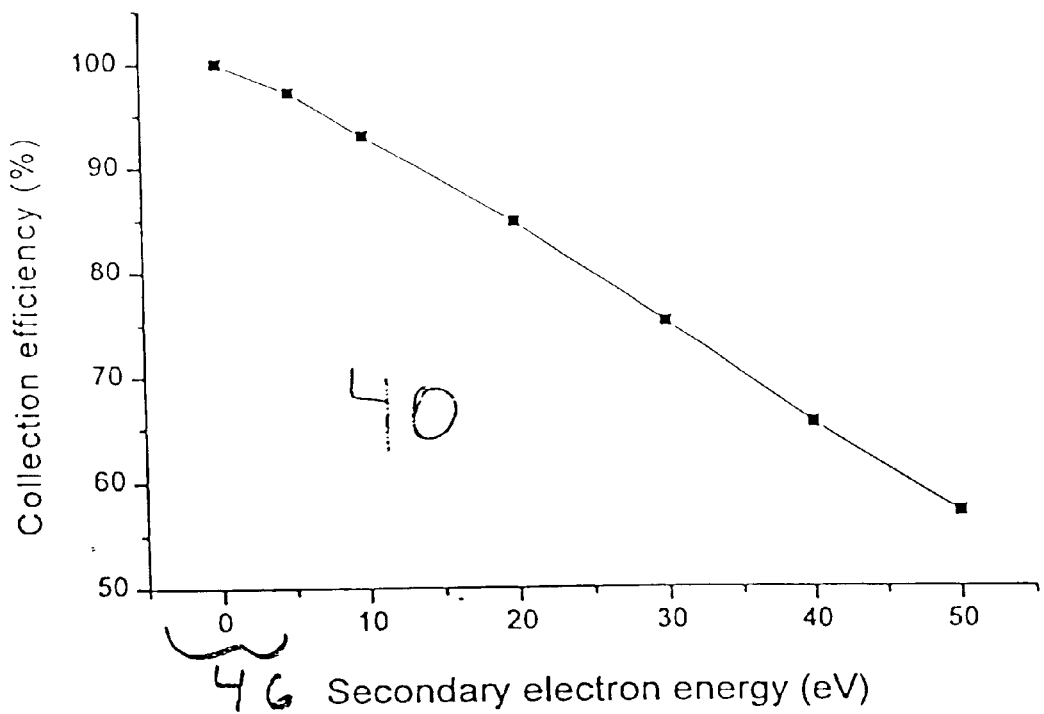
FIG. 4 shows secondary electron collection efficiency as a function of secondary electron energy.

FIG. 4 shows a graph 40 of the collection efficiency as a function of secondary electron energy for the embodiment shown in FIG. 1 having secondary electron energies up to 50 eV. The goal is to have 100% collection efficiency for secondary electrons having energies in the range 0.1–10 eV, moderate collection efficiencies for secondary electrons with energies from 10 eV up to 50 eV, and to minimize the occurrence of arcing. The effects of the electric field generated by the scintillator on the primary beam are minimized. According to FIG. 4, this compact scintillator is very effective for the collection of a large energy range of electrons. In practice, the collection efficiency is virtually 100% since the most probable secondary electron energies are around 05 eV.

Based on the optimization procedures discussed above, we built a scintillator assembly for a 45 mm working distance is also useful, where non-coaxial caps were used to reduce the effect on the primary beam while maintaining the high collection efficiency. The optimized tilt angle for a 45 mm working distance was found to be 33°.

The perturbation of the primary beam due to the scintillator generated electron field was also investigated. Perturbation of the primary beam was observable. For case of dcap=16 mm, distortions in the images were found in addition to detecting image shift. It was found that dcap=10–13 mm gave the most satisfactory performance in terms of image contrast, image distortion and image shift for both working distances. It was found that the size of the scintillator disk is not critical to the collection efficiency, as long as it is positioned to cover the focal spot 34 of the secondary electrons.

After reducing the insulator size in the new design shown in FIG. 1 and FIG. 2, the uncertainty related to charging on the insulator surface had been totally eliminated. As a result, the reliability problems such as drifting, flashing and arcing are not observed.

This disclosure is illustrative and not limiting; further modifications will be apparent to one skilled in the art in light of this disclosure, and are intended to fall within the scope of the appended claims.

What is claimed is:

1. A scintillator assembly comprising:

a scintillator disk;

a base;

a conducting cap surrounding the scintillator disk at a periphery of the scintillator disk such that the scintillator disk is held in place between the base and the conducting cap and the conducting cap is in electrical contact with a front side of the scintillator disk:

an insulator encompassing at least a portion of the base and being disposed substantially outside a path of secondary electrons from a workpiece on which a charged particle beam is incident when the scintillator assembly is in operation;

a grounding cap disposed around and in contact with the insulator and encasing the scintillator disk, the base and the conducting cap; and a light pipe optically coupled to the scintillator disk thereby to receive photons from the scintillator disk when the scintillator assembly is in operation.

2. The scintillator assembly of claim 1, wherein an angle between an axis of the charged particle beam and the front side of the scintillator disk when the scintillator assembly is in operation is such that nearly 100 percent collection efficiency is achieved for secondary electrons with energies of approximately 0.1–10 eV.

3. The scintillator assembly of claim 1, wherein an angle between an axis of the charged particle beam and a the front side of the scintillator disk when the scintillator assembly is in operation is such that collection efficiency greater than 50 percent is achieved for secondary electrons with energies of approximately 10–50 eV.

4. The scintillator assembly of claim 2, wherein the angle is about 29 degrees.

5. The scintillator assembly of claim 2, wherein the angle is about 33 degrees.

6. The scintillator assembly of claim 1, wherein a distance between the grounding cap and the workpiece is about 20 mm when the scintillator assembly is in operation.

7. The scintillator assembly of claim 1, wherein a distance between the grounding cap and the workpiece is about 45 mm when the scintillator assembly is in operation.

8. The scintillator assembly of claim 1, wherein the grounding cap defines a bore having a diameter of about 12 mm.

9. The scintillator assembly of claim 1, wherein the grounding cap defines a bore having a diameter of about 10–13 mm.

10. The scintillator assembly of claim 1, wherein a bias voltage applied to the scintillator disk when the scintillator assembly is in operation is about 8–12 kV.

11. The scintillator assembly of claim 1, wherein a focal spot at which a majority of secondary electrons strike the scintillator assembly when the scintillator assembly is in operation is about 3–4 mm in diameter.

12. A method of operating a scintillator assembly, comprising:

directing a charged particle beam onto a workpiece, thereby causing secondary electrons to be emitted therefrom; and receiving the secondary electrons;

at a scintillator assembly in which a scintillator disk is held in place between a base and a conducting cap through which a biasing voltage is applied to a front side of the scintillator disk upon which the secondary electrons are incident, an insulator encompasses at least a portion of the base and is disposed completely outside a path of the secondary electrons from the workpiece, and a grounding cap is disposed around and in contact with the insulator and encases the scintillator disk, the base and the conducting cap.

* * * * *